United States Patent [19]
Booth, Jr.

[11] Patent Number: 6,078,037
[45] Date of Patent: Jun. 20, 2000

[54] ACTIVE PIXEL CMOS SENSOR WITH MULTIPLE STORAGE CAPACITORS

[75] Inventor: Lawrence A. Booth, Jr., Phoenix, Ariz.

[73] Assignee: Intel Corporation, Santa Clara, Calif.

[21] Appl. No.: 09/061,303

[22] Filed: Apr. 16, 1998

[51] Int. Cl.[7] ................................................ H01J 40/14
[52] U.S. Cl. ................................ 250/208.1; 250/214 R; 327/514; 348/311
[58] Field of Search ........................... 250/208.1, 214 R, 250/214.1; 327/514; 348/297, 308, 310, 311, 313

[56] References Cited

U.S. PATENT DOCUMENTS

| | | | |
|---|---|---|---|
| 5,329,112 | 7/1994 | Mihara | 250/208.1 |
| 5,742,047 | 4/1998 | Buhler et al. | 250/214 R |
| 5,744,807 | 4/1998 | Weisfield | 250/208.1 |
| 5,777,669 | 7/1998 | Uwatoko et al. | 348/311 |

*Primary Examiner*—Stephone B. Allen
*Attorney, Agent, or Firm*—Blakely, Sokoloff, Taylor & Zafman LLP

[57] ABSTRACT

An apparatus and method for improving dynamic rays and motion representation in digital imaging. A light sensitive element such as a photo diode is employed to sense a light level at a surface during a period of time. A plurality of storage elements are associated with the light sensitive element but electrically segregated therefrom by a plurality of sampling transistors by enabling the sampling transistors between the particular storage element and the light sensitive element in a predetermined way. Its dynamic range can be extended and since readout between exposures is not required, exposure may be taken in closer temporal proximity thereby improving motion representation.

16 Claims, 3 Drawing Sheets

ACTIVE PIXEL CMOS SENSOR WITH MULTIPLE STORAGE CAPACITORS

BACKGROUND OF THE INVENTION (1) Field of the Invention

The invention relates to image capture. More specifically, the invention relates to association of a plurality of storage elements with a photosensitive element.

(2) Background

Image sensors have become increasingly common in recent years and digital image capture has made great strides. Typically, digital images are derived from image sensing arrays made up of rows and columns of pixels. Each pixel stores a charge corresponding to the light levels at a point on the surface of the image sensing array at an instant in time or possibly an average over some period of time. FIG. 1 shows a schematic diagram of one example of a pixel. The light sensitive element 10 is disposed so as to collect incident light. The light sensitive element 10 may, for example, be a photodiode. A reset transistor 12 is coupled in series with the photosensitive element 10 between the photosensitive element and the power supply Vcc. The gate of reset transistor 12 is driven by a reset signal which when asserted causes the voltage at a sampling node 20 between the reset transistor 12 and the light sensitive element 10 to be a known voltage, in the figure Vcc. A sampling transistor 14 is coupled between the sampling node 20 and a node 22. Storage element 16 is coupled between capture node 22 and ground. The voltage at collection node 22 drives the gate of readout transistor 18.

A sample signal drives the gate of sampling transistor 14. When the sample signal is asserted, the current corresponding to the light level at the light sensitive element 10 at that time appears at capture node 22 and is captured by storage element 16, which may be a capacitor. When the sample signal is deasserted, transistor 14 is off and current does not flow between sampling node 20 and capture node 22. Thus, the charge on storage element 16 theoretically remains constant until the sample is reasserted causing the voltage at capture node 22 to match the voltage at sampling node 20. When the enable signal that drives the source of readout transistor 18 causes the readout transistor 18 to turn on, by exploiting knowledge of the operation of the transistor in the linear region, a representation of the light level of the image previously stored by light sensitive element 10 is read out on the bitline.

While image sensing arrays instantiated using this pixel configuration have been reasonably successful, they are not particularly effective in video application or where moving subjects are involved. This is caused in part by the fact that the read out time can be quite significant and, therefore, necessitates a time delay between exposures. As a result of this shortcoming, the options are to limit the motion of the subject of a digital photograph or use post-processing to move the object back to where it should have been had it been possible to obtain exposures closer in time.

Additionally, dynamic range of such pixels may be relatively small. Dynamic range is defined by the amount of noise and the transfer function of the photoelectrons generated by the light. A base noise level fundamental to the device is determined and the signal corresponding to the generated photo electrons is added on top. As noise increases, there is less room to add signal and the signal to noise ratio decreases. The signal to noise ratio is also related to time as longer sampling times result in more noise and more signal, while shorter sampling times result in less noise but also less signal. Thus, noise reduction is particularly important because of its effect on the dynamic range.

It would be desirable to be able to increase the dynamic range and reduce noise effects as well as reduce problems related to digital capture of objects in motion.

BRIEF SUMMARY OF THE INVENTION

An apparatus associating a plurality of storage elements with a photo sensitive element is disclosed. A photo sensitive element is provided. A plurality of storage elements are each associated with the photo sensitive element.

DETAILED DESCRIPTION OF THE INVENTION

Figure 2:
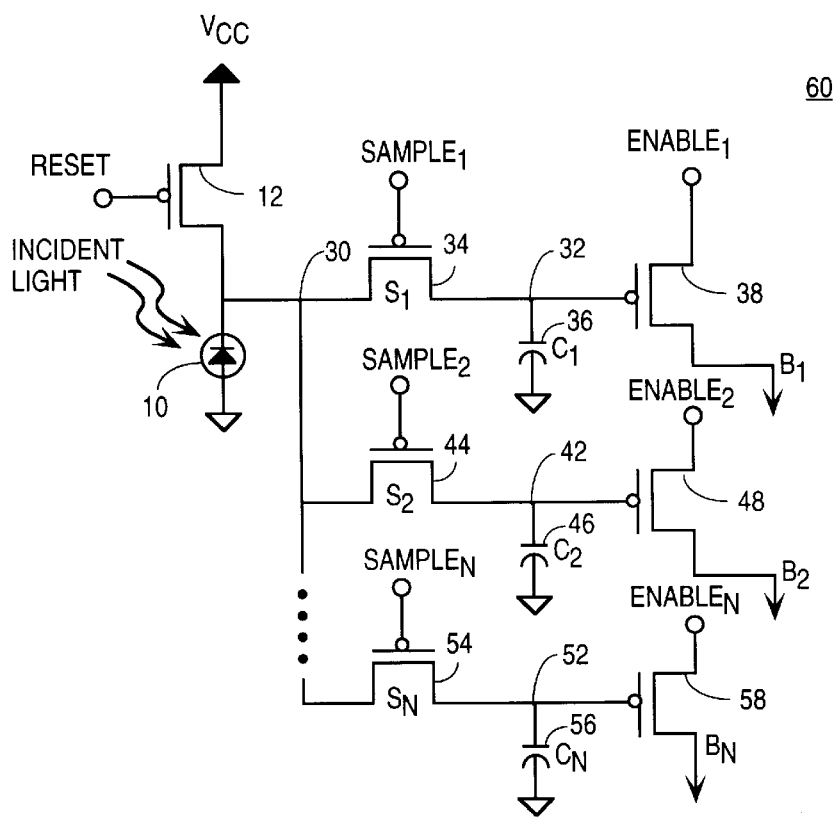
FIG. 2 is a schematic diagram of a pixel of one embodiment of the invention.

FIG. 2 shows a generalized schematic diagram of one embodiment of the invention. A light sensitive element 10 is coupled between a collection node 30 and a ground. A reset transistor 12 is coupled between positive power supply and the sampling node 30. The gate of reset transistor 12 is driven by a reset signal, which when asserted causes the collection node 30 to go to the known voltage of the power supply Vcc. In one embodiment, the light sensing element is the photodiode biased in the saturation region. A plurality of sampling transistors have their source coupled to sampling node 30 and drain coupled to capture nodes 32, 42, 52, respectively. It will be understood by one of ordinary skill in the art that transistors are symmetric devices and therefore, designation of source and drain is arbitrary in the absence of a known voltage condition. Thus, at some points during operation, the source will be connected to sampling node 30 and the drain connected to capture node 32, etc., while in other points during operation, capture node 32 will be connected to the source and sampling node 30 to the drain. The gate of sampling transistors 34, 44, 54 is driven by a plurality of sample signals, $SAMPLE_1$, $SAMPLE_2$, and $SAMPLE_N$, and a storage element, such as capacitor 36 is coupled between collection node 32 and ground. The gate of an output transistor 38 is coupled to collection node 32. The source and drain of output transistor are respectively coupled to an enable signal and a bit line. Similarly, storage element 46 is coupled to collection node 42 and storage element 56 is coupled to node 52. In this embodiment, each collection node is provided with an output transistor 38, 48, 58.

While it is envisioned that up to N (where N is an arbitrarily large number), such sampling transistors, storage elements, and output transistors may be coupled to sampling node 30, the practical number is expected to be limited by the tradeoff between improved imaging capabilities resulting from additional sampling structures with reduced fill factor as a result of less area of the array being devoted to the light sensitive element 10.

Figure 3:
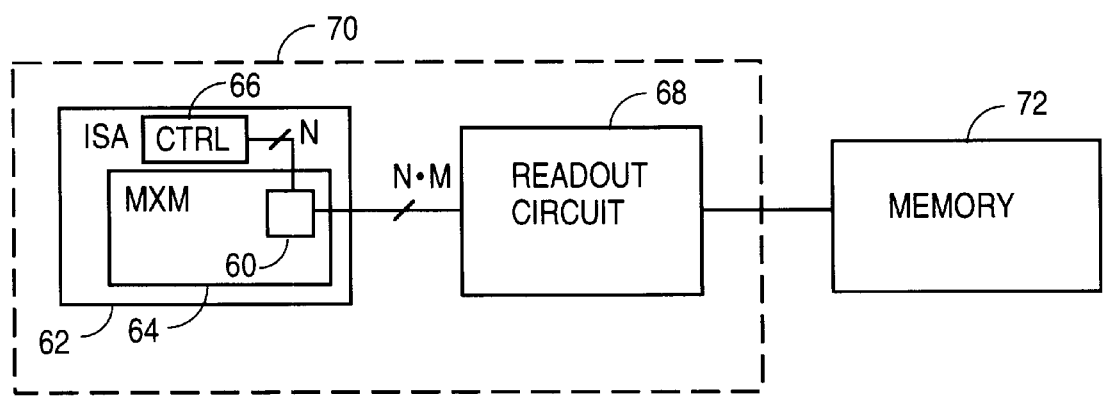
FIG. 3 is a block diagram of a system employing one embodiment of the invention.

FIG. 3 shows a system employing one embodiment of the invention. An image sensing array 62 is provided with photosensitive areas 64 made up of rows and columns of pixels. A pixel 60 may conform to the embodiment shown in FIG. 2. A control circuit 66 provides sample and reset signals to each pixel of the photosensitive area 64. In one embodiment, control circuit 66 includes timers and a state machine. A readout circuit 68 is coupled to the image sensing array 62 and receives the output of each pixel 60. Image sensing array 62 and readout circuit 68 may be instantiated on a single integrated circuit chip 70. A memory 72 is coupled to readout circuit 68 to store values corresponding to an image captured by the image sensing array and readout by the readout circuit 68.

The multiple storage elements associated with each photosensitive element permit the user to take multiple frames in rapid succession. By appropriately adjusting the sampling signals, the exposure during which each frame is taken can be made to overlap. These features permit improved motion representation and significant noise reduction.

With respect to motion representation, the rapid succession results in an image more representative of what is perceived. Just as the eye averages motion, the system can average motion. For example, an aliasing problem that arises in discrete sampling may cause a wagon wheel to appear to be spinning backwards. This aliasing problem can be eliminated by overlapping the samples in time and the low-pass filtering. If the samples are at a high enough rate, low-pass filtering will cause the wagon wheel to be seen as a blur rather than going backwards.

As discussed above, the dynamic range is defined by the amount of noise and the transfer function of the photoelectrons generated by the light. Further, as discussed above, this is related to time because the longer exposure results in more noise and more signal, while the shorter exposure results in less noise and less signal. Thus, if two exposures are taken, one for a short time and one for a longer time, one will have less noise and one will have more signal. By combining the less noise with the more signal, a greater dynamic range is achieved. Averaging two exposures permits noise reduction related to transient noise and/or component specific noise. This is true regardless of the overlap or lack of overlap of the exposures.

Figure 1:
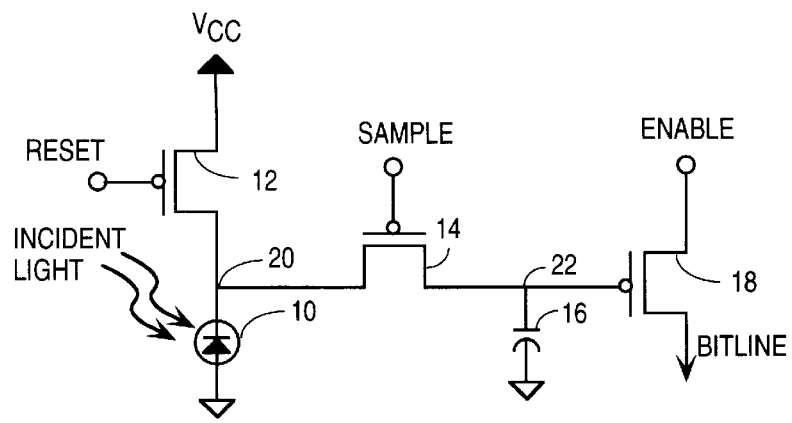
FIG. 1 is a schematic diagram of a prior art pixel configuration.

In one embodiment of the invention, an exposure stored in a first storage element is readout independent of an exposure that may be occurring in another storage element concurrently. Thus, for example, referring to FIG. 1, if SAMPLE$_1$ is asserted again and time t=0 and SAMPLE$_2$ is asserted at t=1, the value stored in capacitor C1 can be readout during t=1 and SAMPLE$_1$ may be reasserted in unit t=2. This permits the possibility of videostyle image capture.

Figure 4:
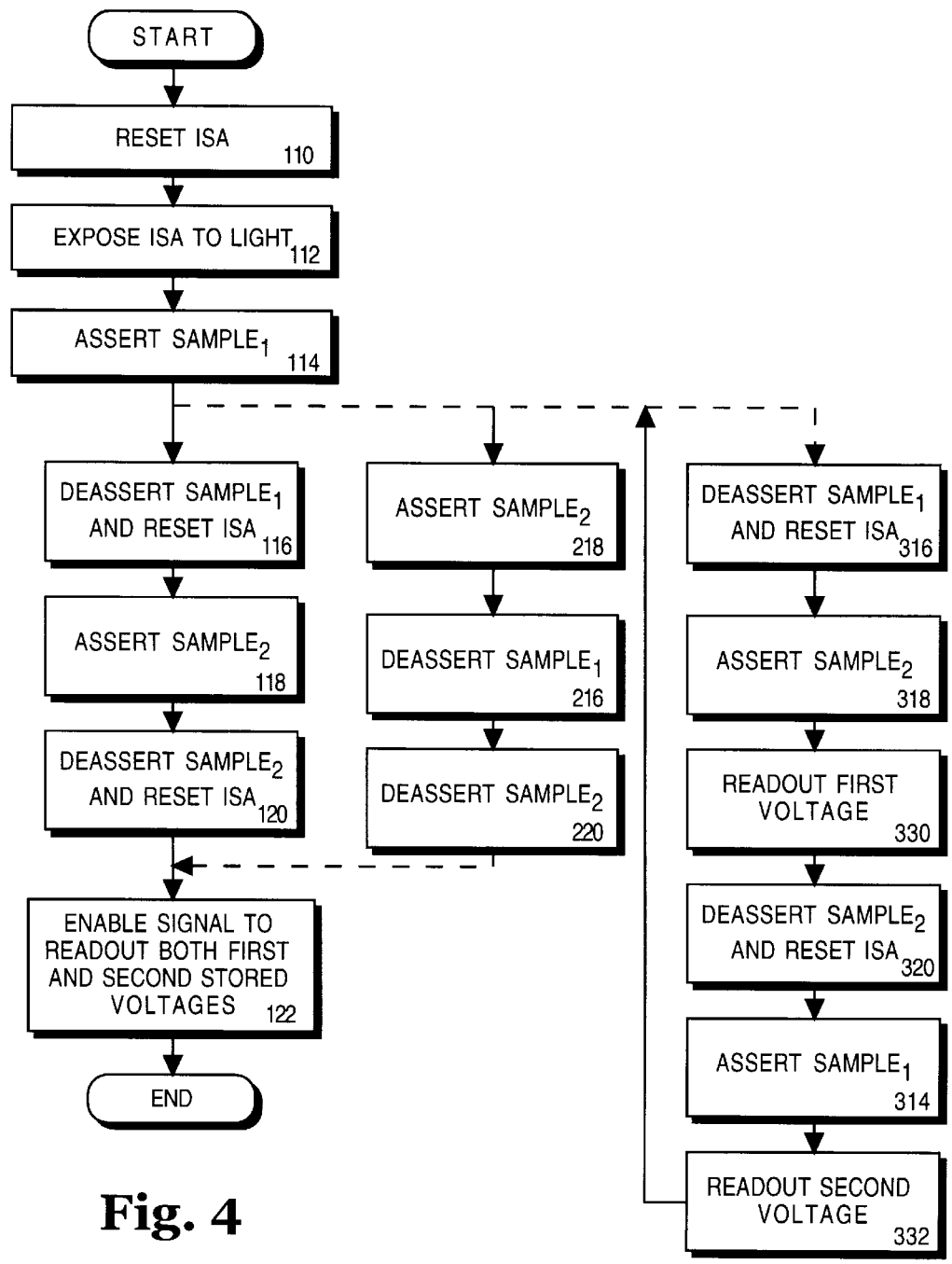
FIG. 4 is a flow chart showing alternative flows of three embodiments of the invention.

FIG. 4 is a flowchart showing flow in three alternative embodiments of the invention. At functional block 110, the image sensing array (ISA) is reset. At functional block 112, the ISA is exposed to light, resulting in a photo current through the photosensitive element resulting in a voltage corresponding to the light level at the surface. At functional block 114, SAMPLE$_1$ is asserted causing the capture of the voltage from the light sensitive element. At functional block 116, SAMPLE$_1$ is deasserted and the ISA reset, thereby ending the capture period for the first storage element of each pixel. At functional block 118, SAMPLE$_2$ is asserted. At functional block 128, SAMPLE$_2$ is deasserted, thereby ending the capture period for the second storage element of the pixel. The ISA is also reset at functional block 120. Then, at functional block 122, the enable signals are asserted to permit the readout of both the first and second stored voltages. This readout may be concurrent or in series. Alternatively, after the assertion of SAMPLE$_1$ at functional block 114, SAMPLE$_2$ may be asserted at functional block 218 some time after the assertion of SAMPLE$_1$. At functional block 216, SAMPLE$_1$ is deasserted. At functional block 220, SAMPLE$_2$ is deasserted. It is possible that the total period during which SAMPLE$_2$ is asserted will be less than the total time during which SAMPLE$_1$ is asserted. After the deassertion of SAMPLE$_2$, both voltages may be readout at functional block 122.

As yet another alternative, following the assertion of SAMPLE$_1$ at functional block 114, SAMPLE$_1$ is deasserted and the ISA reset at functional block 316. Sample$_2$ is asserted at functional block 318. While SAMPLE two is asserted, the first voltage is readout at functional block 330. Sample$_2$ is deasserted at functional block 320 and the ISA reset. Sample$_1$ may then be reasserted at functional block 314. The second voltage is readout at functional block 332 and subsequently, SAMPLE$_1$ is again deasserted at functional block 316. In this embodiment, videostyle capture is possible. While FIG. 4 shows three possible sampling arrangements, numerous other possible sampling arrangements exist and are within the scope and contemplation of the invention.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:
   a photosensitive element;
   a plurality of storage elements each associated with the photosensitive element;
   a reset transistor coupled between a power supply and the photosensitive element; and
   a plurality of sampling transistors, each of the sampling transistors coupled between the photosensitive element and a storage element.

2. The apparatus of claim 1 wherein the plurality of storage elements are capacitors.

3. The apparatus of claim 1 wherein each sampling transistor is responsive to an independent sampling signal.

4. The apparatus of claim 3 further comprising:
   a control logic unit coupled to the sampling transistors to generate the sampling signal for each sampling transistor.

5. The apparatus of claim 3 wherein:
   an assertion of a sampling signal for a first sampling transistor and an assertion of a sampling signal for a second sampling transistor overlap in time.

6. The apparatus of claim 3 wherein an assertion of a sampling signal for a second sampling transistor occurs less than a readout time after an assertion of a sampling signal for a first sampling transistor.

7. A system comprising:
   an image sensing array having a plurality of photosensitive elements, at least one photosensitive element having associated therewith a plurality of storage elements;
   a readout circuit to retrieve a value stored in each of the plurality of storage elements; and
   a memory coupled to the readout circuit to retain a representation of an image corresponding to the values read out.

8. The system of claim 7 wherein the image sensing array further comprises:
- a plurality of sampling transistors, one sampling transistor coupled between each photosensitive element, at least one of the corresponding storage elements; and
- a control logic circuit that controls the assertion of the sampling signal to each of the plurality of sampling transistors.

9. The system of claim 8 wherein the control logic circuit asserts a first sampling signal corresponding to a first sampling transistor coupled between a first photosensitive element and a first storage element and asserts a second sampling signal corresponding to a second sampling transistor coupled between the first photo element and a second storage element such that a first period of assertion of the first sampling signal overlaps a second period of assertion of a second sampling signal.

10. The system of claim 8 wherein the first period of assertion is shorter than the second period of assertion.

11. The system of claim 8 wherein the control logic circuit asserts a first sampling signal corresponding to a first sampling transistor coupled between a first photosensitive element and a first storage element and asserts a second sampling signal corresponding to a second sampling transistor coupled between the first photo element and a second storage element such that a first period of assertion of the first sampling signal is followed less than a read out time by a second period of assertion of a second sampling signal.

12. The system of claim 11 wherein the readout circuit reads out the first storage element during the second period of assertion.

13. A method comprising the steps of:
- exposing a light sensitive element to light;
- asserting a first sampling signal to cause a first storage element to retain a voltage corresponding to the light level at the light sensitive element; and
- asserting a second sampling signal to cause a second storage element to retain a voltage corresponding to the light level at the light sensitive element.

14. The method of claim 13 wherein the first asserting step and the second asserting step overlap in time.

15. The method of claim 13 wherein the first asserting step and the second asserting step occur within less than a readout time of one another.

16. The method of claim 13 further comprising the step of beginning a read out of the first storage element while the second sampling signal is asserted.

* * * * *